(12) United States Patent
Matsubara et al.

(10) Patent No.: US 6,399,478 B2
(45) Date of Patent: Jun. 4, 2002

(54) METHOD OF MAKING A DUAL DAMASCENE STRUCTURE WITH MODIFIED INSULATION

(75) Inventors: Naoteru Matsubara, Gifu-ken; Hideki Mizuhara, Bisai, both of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/788,661

(22) Filed: Feb. 21, 2001

(30) Foreign Application Priority Data

Feb. 22, 2000 (JP) ........................................ 2000-044499

(51) Int. Cl.$^7$ .......................................... H01L 21/4763
(52) U.S. Cl. ...................... 438/623; 438/624; 438/634; 438/637; 438/638; 438/782; 438/783
(58) Field of Search .................... 438/623, 624, 438/634, 637, 638, 782.783

(56) References Cited

U.S. PATENT DOCUMENTS

| | | | | |
|---|---|---|---|---|
| 6,071,807 A | * | 6/2000 | Watanabe et al. | 438/623 |
| 6,127,089 A | * | 10/2000 | Subramanian et al. | 438/624 |
| 6,214,749 B1 | * | 4/2001 | Watanabe et al. | 438/783 |
| 6,245,662 B1 | * | 6/2001 | Naik et al. | 438/637 |
| 6,251,806 B1 | * | 6/2001 | Chang et al. | 438/782 |
| 6,268,283 B1 | * | 7/2001 | Huang | 438/638 |
| 6,271,127 B1 | * | 8/2001 | Liu et al. | 438/638 |
| 6,284,657 B1 | * | 9/2001 | Chooi et al. | 438/637 |

* cited by examiner

*Primary Examiner*—John F. Niebling
*Assistant Examiner*—Lynne A. Gurley
(74) *Attorney, Agent, or Firm*—Armstrong, Westerman & Hattori, LLP

(57) ABSTRACT

A semiconductor device having a dual damascene structure having a highly reliable multilayered interconnection is applied to the present invention. A protective film (12) is formed on a first interconnection (11), and a modified SOG film (13*a*) is then provided thereon. An etch stopper film (14) is formed on the modified SOG film (13*a*), and a modified SOG film (15*a*) is then formed. The modified SOG film (15*a*), the etch stopper film (14), and the modified SOG film (13*a*) are etched away using a resist pattern, to form a via hole (17). The modified SOG film (15*a*) is etched away using the resist pattern, to form a recess (19) serving as a trench interconnection portion. The etch stopper film (14) and the protective film (12) which are exposed are removed, and the recess is filled with a conductive material (20), to form a conductive plug in the via hole and a second interconnection.

12 Claims, 3 Drawing Sheets

METHOD OF MAKING A DUAL DAMASCENE STRUCTURE WITH MODIFIED INSULATION

BACKGROUND OF THE INVENTION

1. Field of the Invention

The present invention relates generally to a semiconductor device having a multilayered interconnection structure, and more particularly, to a method of fabricating a semiconductor device having a dual damascene structure.

2. Description of Prior Art

It has been important to make interconnections fine and multilayered as semiconductor integrated circuits have been increased in integration density. Dual damascene structures for simultaneously forming trench interconnections and via holes have been paid attention to because it is possible to reduce cost and increase throughput by reducing the number of steps, and it is possible to lower resistance and lengthen the life of electromigration by using Cu interconnections.

A method of forming a conventional dual damascene structure will be described with reference to FIGS. 2A to 2D.

As shown in FIG. 2A, a lower trench interconnection layer 31 is formed using copper (Cu), and a protective film 32, an interlayer insulation film 33, an etch stopper film 34, and an interlayer insulation film 35 are deposited thereon as a first step. The Cu interconnection is easily oxidized when it reaches a high temperature of not less than 150° C. in an atmosphere of oxygen or vapor, so that interconnection resistance is raised. Further, Cu in the interconnection is ionized and is diffused into a silicon dioxide film. Consequently, it is impossible to directly form the silicon dioxide film on the Cu interconnection by plasma CVD (Chemical Vapor Deposition) because the Cu interconnection is oxidized and diffused.

Therefore, after the lower trench interconnection layer 31 is formed, the protective film 32 composed of a silicon nitride film is then provided on the interconnection. Further, the depth of a trench corresponds to the thickness of the interconnection. In order to prevent the interconnection resistance from varying, a trench having a uniform depth must be formed in the interlayer insulation film 35. In forming the interlayer insulation film 35, therefore, an etch stopper film 34 composed of a silicon nitride film having a high etching selection ratio to the silicon dioxide film is formed.

After the interlayer insulation films 33 and 35 are formed, as described above, a resist pattern 36 is formed by a normal exposure method, to provide a via hole 37 by anisotropic etching, as a second step, as shown in FIG. 2B. After the step, a resist pattern 38 is formed by a normal exposure method, to provide an interconnection portion with an opening 39 by anisotropic etching, as a third step, as shown in FIG. 2C.

Thereafter, a dual damascene interconnection structure is formed in the step of embedding a metal 40 such as copper, tungsten, or aluminum, as a fourth step, as shown in FIG. 2D.

On the other hand, capacitance between interconnections is increased by increasing the density of the interconnection, thereby preventing the speed of the semiconductor integrated circuit from being increased. As a method for solving the problem, an interlayer insulation film having a low dielectric constant is used.

Examples of the interlayer insulation film having a low dielectric constant which is applied to the dual damascene structure include a fluorine-added silicon oxide film, an organic SOG (Spin on Glass) film, and an organic polymer film.

SOG is a generic term of a film mainly composed of a solution obtained by dissolving a silicon compound in an organic solvent and silicon dioxide formed from the solution. The organic SOG film has an organic component contained in a silicon compound, as expressed by a general formula (1):

$$[R_xSiO_y]_n \quad (1)$$

(n, x, y: an integer, R: an alkyl group or an aryl group).

SUMMARY OF THE INVENTION

The above-mentioned organic SOG film is superior in low dielectric constant, embedding properties, and cost. However, the organic SOG film on a sidewall of the via hole is brought into a void state in the second, third, and fourth steps, thereby making it impossible to obtain good electrical properties.

As described above, a silicon nitride film having a high dielectric constant is generally used for the protective film 32 and the etch stopper film 34 in the dual damascene structure. Even if a material having a low dielectric constant is used for the interlayer insulation film, therefore, the total capacitance between interconnections is increased. In order to avoid the increase, thinning of and an alternative to the silicon nitride film have been examined, which introduce a problem in terms of productivity and reliability.

By removing the protective film 32 at the bottom of the via hole after the second step, the lower interconnection layer is degraded at the time of removing resist in the third step, thereby raising resistance and degrading reliability.

The present invention has been made in view of such circumstances, and its object is to provide a method of fabricating a semiconductor device having a highly reliable multilayered interconnection.

A method of fabricating a semiconductor device according to the present invention is characterized by comprising the steps of forming a first insulation film on a first interconnection; forming a coating film on the first insulation film and forming a second insulation film which has been modified by implanting impurities into the coating film; forming a third insulation film serving as an etch stopper on the second insulation film; forming a coating film on the third insulation film and forming a fourth insulation film which has been modified by implanting impurities into the coating film; forming a resist pattern, and etching away the fourth insulation film, the third insulation film, and the second insulation film using the resist pattern, to form a via hole; etching away the fourth insulation film in order to form a recess serving as a trench interconnection portion using the resist pattern; etching away the third insulation film and the first insulation film which are exposed; and filling the recess with a conductive material, to form a conductive plug in the via hole and a second interconnection.

The present invention can be so constructed that the step of forming the second interconnection comprises the step of forming the second interconnection simultaneously with the via hole for electrically connecting the first interconnection and the second interconnection.

The second and fourth insulation films may use an organic polymer as the coating film, and may be modified by implanting impurities into the organic polymer by ion-implantation.

Organic SOG can be used as the organic polymer.

As described above, the present invention uses as an interlayer insulation film an insulation film having impurities contained in a coating film, for example, an organic SOG film which has been modified by ion-implanting impurities. The etching selection ratio of the insulation film which has been modified by containing the impurities in the coating film to the first and fourth insulation films respectively serving as a protective film and an etch stopper film is improved. For example, the etching selection ratio of the modified organic SOG film to the silicon nitride film is increased. Therefore, the first insulation film (the protective film) and the fourth insulation film (the etch stopper film) can be simultaneously removed after the via hole and the trench interconnection are provided.

As a result, according to the present invention, good via contact properties are obtained, and it is possible to reduce capacitance between interconnections by reducing the volume of the silicon nitride film as well as to obtain an interconnection having low resistance and high reliability by reducing damage to the lower interconnection layer.

The foregoing and other objects, features, aspects and advantages of the present invention will become more apparent from the following detailed description of the present invention when taken in conjunction with the accompanying drawings.

DESCRIPTION OF PREFERRED EMBODIMENT

Figure 1A:
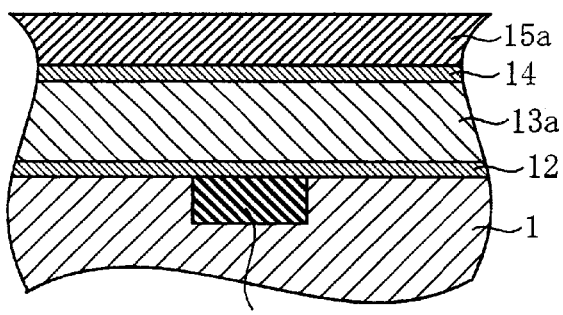
FIGS. 1A to 1F are cross-sectional views showing the steps of a method of fabricating a semiconductor device according to the present invention.

Referring now to the drawings, an embodiment of the present invention will be described.

FIGS. 1A to 1F are cross-sectional views showing the steps of a method of fabricating a semiconductor device according to the present invention.

As shown in FIG. 1A, a low trench interconnection layer 11 is formed in a substrate 1 using Cu, and a protective film 12 serving as a first insulation film is then deposited in order to protect the interconnection. The protective film 12 is formed by forming a silicon nitride film using plasma CVD.

The silicon nitride film is formed by plasma CVD under a film formation temperature of 360° C., an RF power of 420 W, and 500 Pa using monosilane ($SiH_4$), nitrogen ($N_2$), and ammonia gas ($NH_3$).

An organic SOG film is then applied over the protective film 12 and sintered. Ions are implanted into the organic SOG film, thereby forming a modified SOG film 13a. The modified SOG film 13a serves as a second insulation film.

The composition of the organic SOG film is [$CH_3Si(OH)_3$].

In a method of forming the organic SOG film, a solution obtained by dissolving a silicon compound in an organic solvent is dropped on the substrate 1, and the substrate 1 is rotated, to form a film of the solution on the protective film 12. By successively performing, in an atmosphere of nitrogen, heat treatment for one minute at 100° C., for one minute at 200° C., for one minute at 300° C., for 30 minutes at 200° C., and for 30 minutes at 300° C., alcohols are vaporized, and polymerization reaction progresses, thereby forming an organic SOG film having a flat surface.

Argon ions ($Ar^+$) are doped into the organic SOG film under conditions of an acceleration energy of 140 keV, and a dosage of $1 \times 10^{15}$ atoms/$cm^2$ using ion-implantation. By the ion-implantation, an organic component in the organic SOG film is decomposed, and the amount of moisture and a hydroxyl group contained in the film is decreased. Accordingly, the organic SOG film is modified into an SOG film containing no organic component and containing a small amount of moisture and a hydroxyl group. In the present invention, the SOG film is referred to as a modified SOG film 13a. The modified SOG film 13a is formed to a uniform thickness because there exists no step caused by the interconnection.

A technique for implanting argon ions into an organic SOG film, to decompose an organic component in the film, and decreasing the amount of moisture and a hydroxyl group contained in the film is disclosed in U.S. Pat. No. 6,071,807, for example.

An etch stopper film 14 serving as a third insulation film is then formed. The etch stopper film 14 is formed by forming a silicon nitride film using plasma CVD. The etch stopper film 14 is formed similarly to the protective film 12.

An organic SOG film is then applied over the etch stopper film 14 and sintered, and ions are implanted, to form a modified organic SOG film 15a, similarly to the modified SOG film 13a. The modified SOG film 15a serves as a fourth insulation film. The modified SOG film 15a is formed to a uniform thickness because there exists no step caused by the interconnection.

Although in the above-mentioned example, description was made of a method of modifying the organic SOG films 13a and 15a by implanting ions twice, the organic SOG films may be modified by implanting ions once or a plurality of times.

Figure 1B:
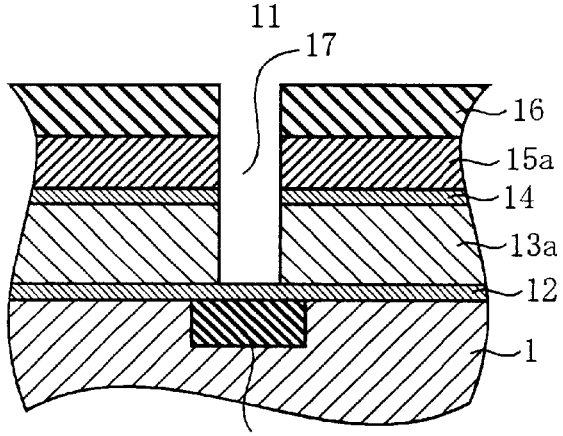

As shown in FIG. 1B, a resist pattern 16 is then formed by a normal exposure method, and a via hole 17 is provided by anisotropic etching. The anisotropic etching is performed by RIE (Reactive Ion Beam Etching) under 10 Pa using $O_2$, $C_4F_6$, or Ar gas, for example. Since the etching selection ratio of the modified SOG film 13a to the protective film 12 is high, the protective film 12 remains with the modified SOG film 13a removed.

Figure 1C:
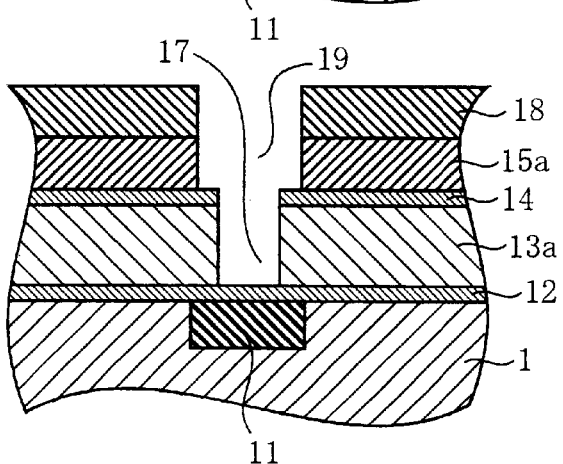

Thereafter, as shown in FIG. 1C, a resist pattern 18 is formed by a normal exposure method, and an opening 19 for a trench interconnection is then formed by anisotropic etching, similarly to the above-mentioned etching. Since the etching selection ratio of the modified SOG film 15a to the protective film 12 and the etch stopper film 14 is high, the protective film 12 and the etch stopper film 14 remain with the modified SOG film 15a removed to form the opening 19.

Figure 1D:
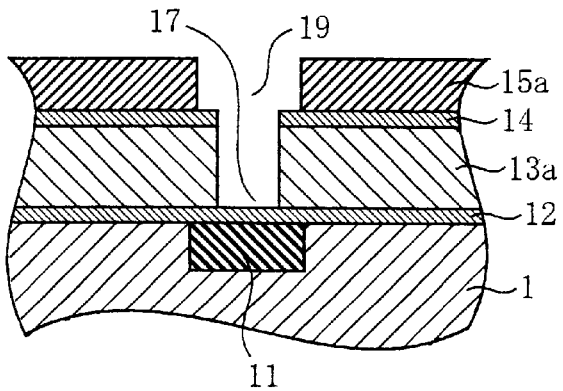

As shown in FIG. 1D, the resist 18 is then removed. In the step, the organic SOG film can be processed without being brought into a void state because it is modified. Moreover, it is significantly effective not to degrade the lower interconnection layer 11 because the protective film 12 remains.

Figure 1E:
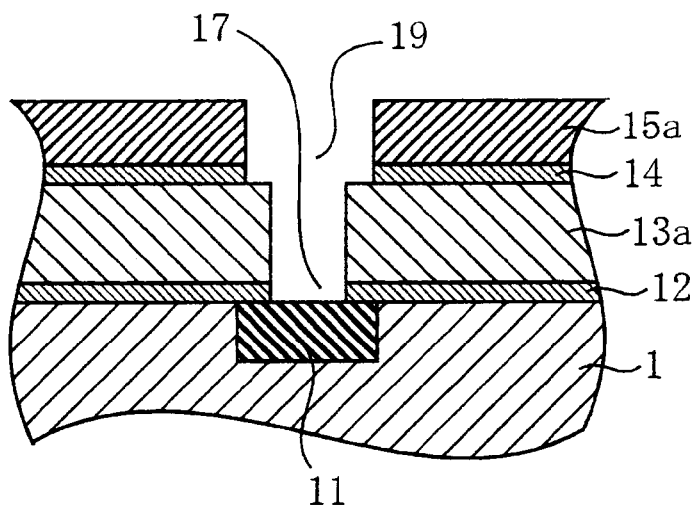

As shown in FIG. 1E, the modified SOG film 15a to which ions have been implanted is then used as a mask, to etch the protective film 12 and the etch stopper film 14 which are exposed. The etching is performed by RIE under 10 Pa using $CF_4$, $CHF_3$, $O_2$, or Ar gas, for example.

Although in a normal dual damascene structure, an etch stopper film just below a trench interconnection remains, the method according to the present embodiment has the effect of reducing capacitance between interconnections because the etch stopper film just below the trench interconnection is removed without remaining.

Figure 1F:
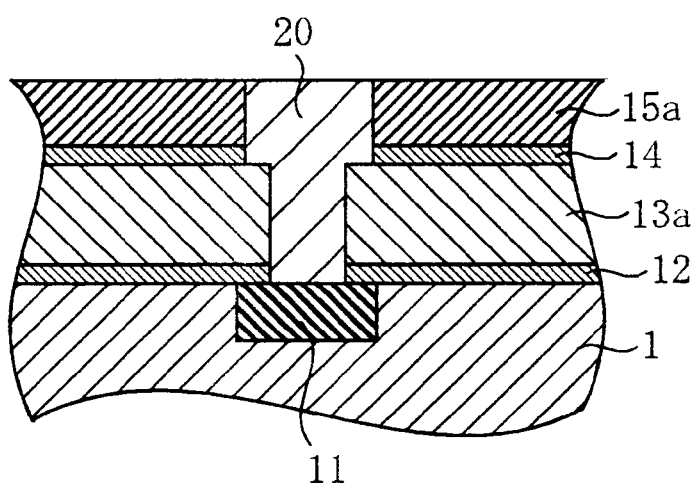
Figure 2A:
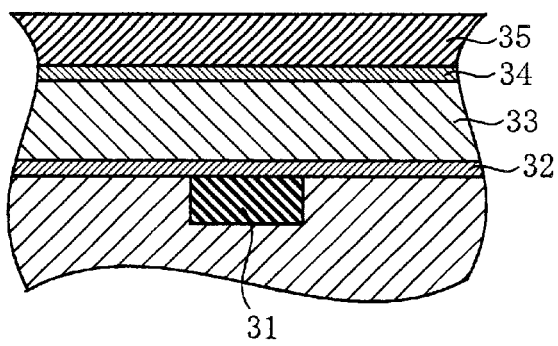
FIGS. 2A to 2D are cross-sectional views showing the steps of a method of fabricating a conventional semiconductor device.
Figure 2B:
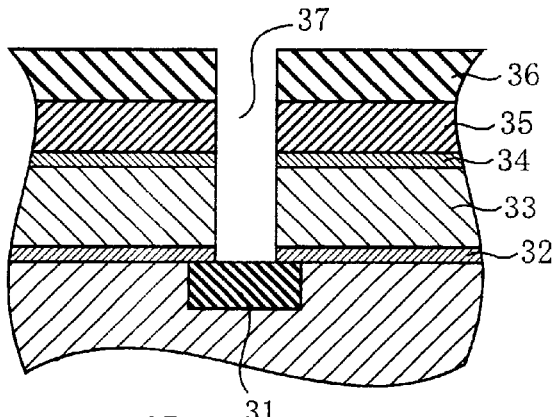
Figure 2C:
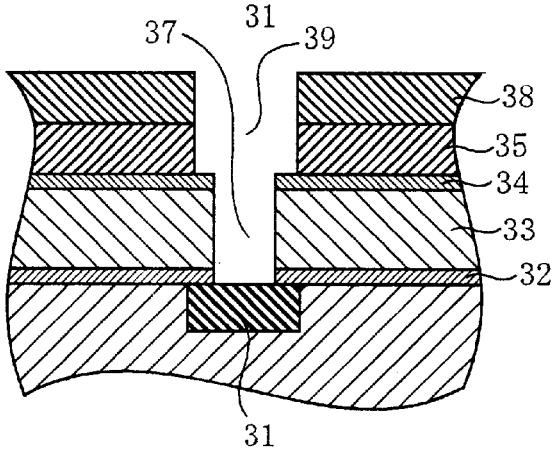
Figure 2D:
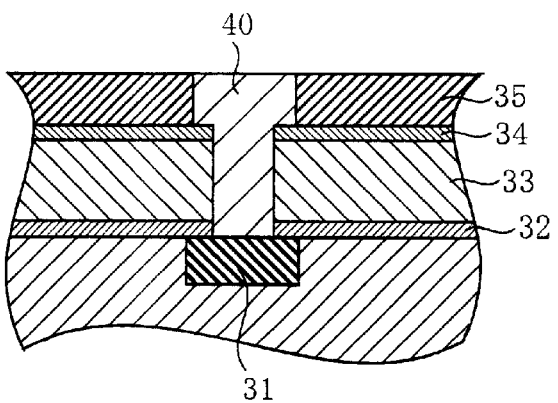

Thereafter, as shown in FIG. 1F, an embedded contact an embedded interconnection are simultaneously formed by filling with the conductive material 20. Examples of the conductive material include copper, aluminum, and tungsten.

When copper is used as a conductive material, the copper is easily diffused into a silicon oxide film, which is formed by plasma CVD, frequently used as an interlayer insulation film. In order to restrain the diffusion, therefore, a barrier metal such as Ti, Ta, TiN, TaN, TiW, or TaW is generally formed before forming the copper. When such a barrier metal is formed, however, the resistance of the barrier metal is higher than that of the copper. Therefore, the interconnection resistance of the entire trench interconnection is higher, as compared with that in a case where the trench interconnection is formed of only the copper. On the other hand, in the present embodiment, the modified SOG film having a low copper diffusion rate, which is approximately the same as that of a silicon nitride film, is used as an interlayer insulation film. Accordingly, the barrier metal can be thinned or omitted. As a result, it is possible to prevent the interconnection resistance from being increased.

As described in the foregoing, according to the present embodiment, the ratio of a silicon nitride film can be made lower, and an interconnection having lower resistance and higher reliability can be formed, as compared with those in the conventional method.

Although the modified SOG films 13a and 15a are formed by implanting impurities thereinto by ion-implantation, the same effect as that of the present invention is obtained even if the organic SOG film is replaced with polyimide or a polysiloxane-denatured polyimide film, and a film modified by implanting impurities thereinto by ion-implantation is used as an interlayer insulation film. The above-mentioned films, including the organic SOG film, are generically referred to as an organic polymer (or an organic rotary coating film).

When the organic SOG film is replaced with an inorganic SOG film having no organic component contained in a silicon compound, and the film is modified by implanting impurities thereinto using ion-implantation, the amount of moisture and a hydroxyl group contained in the inorganic SOG film can be decreased. Even if the modified SOG film is used, the same effect as that in the present invention can be expected.

Although in the above-mentioned embodiment, argon ions are used as ions to be implanted into the organic SOG film, any ions may be used, provided that they modify the organic SOG film.

Specifically, argon ions, boron ions, and nitrogen ions are most suitable. The effect can be sufficiently expected even by using the following ions in addition to the above-mentioned most suitable ions.

There are inert gas ions other than argon ions, for example, helium ions, neon ions, krypton ions, and radon ions.

The same effect can be expected even by using element unitary ions of the groups IIIb, IVb, Vb, VIb, and VIIb other than boron ions and nitrogen ions and their compound ions, and particularly element unitary ions of oxygen, aluminum, sulfur, chlorine, gallium, germanium, arsenic, selenium, bromine, antimony, iodine, indium, tin, tellurium, lead, and bismuth, and their compound ions.

With respect to the metal element ions out of the ions, the dielectric constant of the organic SOG film after ion-implantation may be reduced. However, the amount of the ions to be implanted is very small. Therefore, there is no problem in practical use in cases other than a case where an interlayer insulation film having a particularly high dielectric constant is required.

The same effect can be expected even by using element unitary ions of the groups IVa and Va and their compound ions, and particularly element unitary ions of titanium, vanadium, niobium, hafnium, and tantalum, and their compound ions.

An oxide of the element of each of the groups IVa and Va has a high dielectric constant, thereby making it possible to increase the dielectric constant of the organic SOG film after ion-implantation.

Furthermore, the plurality of ions may be used in combination. In this case, it is possible to obtain a more superior effect by a synergistic effect of the ions.

Although in the above-mentioned embodiment, the ions are implanted into the organic SOG film, the ions may be replaced with atoms, molecules, or particles having a kinetic energy (they shall be generically referred to as impurities in the present invention).

As described in the foregoing, according to the present invention, an interlayer insulation film composed of an insulation film which has been modified by containing impurities in a coating film is applied to a dual damascene structure, thereby making it possible to form a semiconductor device having interconnections between which resistance is reduced and which have low resistance and high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:
   forming a first insulation film on a first interconnection;
   forming a coating film on the first insulation film and forming a second insulation film by modifying the coating film by implanting ion impurities into the coating film;
   forming a third insulation film serving as an etch stopper on the second insulation film;
   forming a coating film on the third insulation film and forming a fourth insulation film by modifying the coating film by implanting impurities into the coating film;
   etching away the fourth insulation film, the third insulation film, and the second insulation film, to form a via hole;
   etching away the fourth insulation film in order to form a recess serving as a trench interconnection portion; then
   etching away the third insulation film and the first insulation film which are exposed; and
   filing the recess with a conductive material, to form a conductive plug in the via hole and a second interconnection.

2. The method according to claim 1, wherein
   the step of forming said second interconnection comprises the step of forming the second interconnection simultaneously with the via hole for electrically connecting the first interconnection and the second interconnection.

3. The method according to claim 1, wherein said second and fourth insulation films are formed by modification of said coating films by using an organic polymer as the coating film and implanting impurities into the organic polymer by ion-implantation.

4. The method according to claim 1, wherein said first and third insulation films include a silicon nitride film.

5. The method according to claim 3, wherein said organic polymer is an organic SOG film.

6. The method according to claim 5, wherein said impurities to be ion-implanted into the organic SOG film are ions selected from the group consisting of argon ions, boron ions, and nitrogen ions.

7. The method according to claim 5, wherein said impurities to be ion-implanted into the organic SOG film are ions selected from the group consisting of helium ions, neon ions, krypton ions, and radon ions.

8. The method according to claim 5, wherein said impurities to be ion-implanted into the organic SOG film are ions selected from the group consisting of element unitary ions of oxygen, aluminum, sulfur, chlorine, gallium, germanium, arsenic, selenium, bromine, antimony, iodine, indium, tin, tellurium, lead, and bismuth, and their compound ions.

9. The method according to claim 5, wherein said impurities to be ion-implanted into the organic SOG film are ions selected from the group consisting of element unitary ions of titanium, vanadium, niobium, hafnium, and tantalum, and their compound ions.

10. The method according to claim 3, wherein said organic polymer is polyimide or polysiloxane-denatured polyimide.

11. The method according to claim 1, wherein said second and fourth insulation films are formed by modification of said coating films by using inorganic SOG as a coating film and implanting impurities into the inorganic SOG by ion-implantation.

12. A method of fabricating a semiconductor device, comprising the steps of:

forming a first insulation film on a first interconnection;

forming a coating film on the first insulation film and forming a second insulation film by modifying the coating film by implanting impurities into the coating film;

forming a third insulation film serving as an etch stopper on the second insulation film;

forming a coating film on the third insulation film and forming a fourth insulation film by modifying the coating film by implanting impurities into the coating film;

etching away the fourth insulation film, the third insulation film, and the second insulation film, to form a via hole;

etching away the fourth insulation film in order to form a recess serving as a trench interconnection portion; then etching away the third insulation film and the first insulation film which are exposed; and filling the recess with a conductive material, to form a conductive plug in the via hole and a second interconnection.

* * * * *